US010000956B2

(12) United States Patent
Whitaker et al.

(10) Patent No.: US 10,000,956 B2
(45) Date of Patent: *Jun. 19, 2018

(54) BREAK AWAY DOOR, TRIP UNIT AND CIRCUIT BREAKER ASSEMBLY INCLUDING SAME

(71) Applicant: EATON CORPORATION, Cleveland, OH (US)

(72) Inventors: Thomas Alan Whitaker, North Huntingdon, PA (US); Jason Eric Basta, Oakdale, PA (US); Doel Jafeth Collazo, McDonald, PA (US); Paul Richard Rakus, Beaver Falls, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/586,411

(22) Filed: May 4, 2017

(65) Prior Publication Data

US 2017/0234047 A1  Aug. 17, 2017

Related U.S. Application Data

(63) Continuation of application No. 14/577,376, filed on Dec. 19, 2014, now Pat. No. 9,679,732.

(51) Int. Cl.
*H01H 3/42* (2006.01)
*E05D 7/10* (2006.01)
(Continued)

(52) U.S. Cl.
CPC ........... *E05D 7/1066* (2013.01); *E05D 3/022* (2013.01); *E05D 7/1077* (2013.01); *H01H 71/025* (2013.01); *H01H 71/12* (2013.01)

(58) Field of Classification Search
CPC ..... E05D 7/1066; E05D 3/022; E05D 7/1077; H01H 71/025; H01H 71/12
(Continued)

(56) References Cited

U.S. PATENT DOCUMENTS 5,361,456 A   11/1994   Newby, Sr.
5,909,164 A    6/1999   Lee
(Continued)

FOREIGN PATENT DOCUMENTS

JP    S57 33877 U     2/1982
JP    H06 10572 U     2/1994
WO    2006/115322 A1  11/2006

OTHER PUBLICATIONS

European Patent Office, "International Search Report and Written Opinion" (for corresponding application PCT/US2015/056552), dated Jan. 26, 2016, 15 pp.

*Primary Examiner* — Edwin A. Leon
*Assistant Examiner* — Lheiren Mae A Caroc
(74) *Attorney, Agent, or Firm* — Eckert Seamans

(57) ABSTRACT

A hinge assembly includes first and second portions. One of the first and second portions includes first and second receptacles and the other one of the first and second portions includes first and second cylindrical members extending in opposite directions along a hinge axis and a thickened portion having a contoured outer surface disposed adjacent the cylindrical members. The second portion is moveable from: a first state wherein the first and second cylindrical members are disposed in the first and second receptacles such that the second portion is coupled to the first portion and generally free to rotate about the hinge axis through at least a predetermined degree range, and a second state in which the second portion is decoupled from the first portion responsive to the second portion being rotated beyond the (Continued)

predetermined degree range and the contoured outer surface interacting with a portion of the first portion.

15 Claims, 9 Drawing Sheets

(51) Int. Cl.
    *H01H 71/02*     (2006.01)
    *H01H 71/12*     (2006.01)
    *E05D 3/02*     (2006.01)

(58) Field of Classification Search
    USPC .......................... 200/573, 260, 262, 355, 356
    See application file for complete search history.

(56) References Cited

U.S. PATENT DOCUMENTS

| | | |
|---|---|---|
| 5,979,016 A | 11/1999 | Fan |
| 6,229,418 B1 | 5/2001 | Mueller et al. |
| 6,373,358 B1 | 4/2002 | Davies et al. |
| 9,679,732 B2 * | 6/2017 | Whitaker ................ E05D 3/022 |
| 2004/0066595 A1 | 4/2004 | Tignor et al. |
| 2009/0049648 A1 | 2/2009 | Williams et al. |

* cited by examiner

BREAK AWAY DOOR, TRIP UNIT AND CIRCUIT BREAKER ASSEMBLY INCLUDING SAME

CROSS-REFERENCE TO RELATED APPLICATIONS

This application is a continuation of U.S. patent application Ser. No. 14/577,376, filed Dec. 19, 2014, entitled "BREAK AWAY DOOR, TRIP UNIT AND CIRCUIT BREAKER ASSEMBLY INCLUDING SAME", the contents of which are incorporated herein by reference.

BACKGROUND

Field

The disclosed concept relates generally to circuit breakers, and in particular, to trip units for use in circuit breakers. The invention further relates to access doors for use in trip units.

Background Information

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Circuit breakers typically include separable contacts. The separable contacts may be operated either manually by way of an operator handle or automatically in response to a detected fault condition. Typically, such circuit breakers include an operating mechanism, which is designed to rapidly open the separable contacts, and a trip mechanism, such as a trip unit, which senses a number of fault conditions to trip the breaker automatically. Upon sensing a fault condition, the trip unit trips the operating mechanism to a trip state, which moves the separable contacts to their open position.

Some trip units include an access door which allows for easy access to switches which control trip unit settings without requiring removal of one or more covers which are typically secured to a housing of the circuit breaker via screws or other suitable fasteners. Such access doors are typically formed from a clear plastic material. Such construction provides a number of benefits. One of such benefits of utilizing such a clear material is that the switches covered by such access doors and thus the settings thereof may be readily viewed without requiring the access door to be opened. Another benefit of using such material is the generally low cost of the material and forming thereof.

While there are a number of benefits of such present designs, there is still room for improvement as access doors tend to be less than durable and may be rather easily broken if care is not taken. Typically, such breakage occurs when a technician is installing and/or servicing a circuit breaker and thus has the front cover removed. During such time, it is common to have the access door of the trip unit open for making adjustments to the unit. Being formed from clear material, the access door tends to not stand out and can be easily left in an open position. When disposed in the open position, the access door is generally fragile and can be rather easily broken, typically at the hinged portion thereof, if opened beyond its intended range. Such over-opening may readily occur if the access door is contacted while disposed in an open position such as by a technician moving in the vicinity of the access door or by attempting to install the front cover without having first closed the access door.

There is thus room for improvement in access doors for trip units.

There is also room for improvement in trip units employing access doors, and circuit breakers employing such trip units.

SUMMARY

These needs and others are met by embodiments of the disclosed concept in which are directed to a hinge assembly. The hinge assembly comprises a first portion and a second portion. The first portion includes a first receptacle and a second receptacle. The second portion includes a first cylindrical member extending along a hinge axis in a first direction, a second cylindrical member extending along the hinge axis in a second direction opposite the first direction, and a thickened portion having a contoured outer surface disposed adjacent the first cylindrical member and the second cylindrical member. The second portion is moveable from: (i) a first state wherein the first cylindrical member is disposed in the first receptacle and the second cylindrical member is disposed in the second receptacle such that the second portion is coupled to the first portion and generally free to rotate about the hinge axis through at least a predetermined degree range, and (ii) a second state in which the second portion is decoupled from the first portion responsive to the second portion being rotated beyond the predetermined degree range and the contoured outer surface interacting with a portion of the first portion.

Each of the first receptacle and the second receptacle may comprise a main portion defined at least in-part by a curved surface disposed generally a radial distance about the hinge axis, and when disposed in the first state, the first cylindrical member is disposed in the main portion of the first receptacle and the second cylindrical member is disposed in the main portion of the second receptacle.

Each of the first receptacle and the second receptacle further includes an opening which extends outward from the main portion and is positioned generally about a central reference line.

The opening of each of the first receptacle and the second receptacle includes a first portion defined by generally parallel surfaces which extend outward from the main portion and define a minimum opening width of each of the first receptacle and the second receptacle, and when moving from the first state to the second state at least one of the first cylindrical member passes through the first portion of the first receptacle or the second cylindrical member passes through the first portion of the second receptacle.

The opening of each of the first receptacle and the second receptacle may further include a flared portion extending outward from the first portion in which the opening widens from the minimum opening width.

Each of the first cylindrical member and the second cylindrical member may be defined by an outer diameter which is greater than the minimum width and less than twice the radial distance.

Such needs are also met by embodiments of the disclosed concept which are directed to a trip unit. The trip unit comprises: a housing and an access door. The housing includes a first receptacle and a second receptacle formed thereon or therein. The access door includes a first cylindrical member extending along a hinge axis in a first direction, a second cylindrical member extending along the hinge axis in a second direction opposite the first direction, and a thickened portion having a contoured outer surface disposed adjacent the first cylindrical member and the second cylindrical member. The access door is moveable from: (i) a first state wherein the first cylindrical member is disposed in the first receptacle and the second cylindrical member is disposed in the second receptacle such that the access door is coupled to the housing and generally free to rotate about the hinge axis through at least a predetermined degree range, and (ii) a second state in which the access door is decoupled from the housing responsive to the access door being rotated beyond the predetermined degree range and the contoured outer surface interacting with a portion of the housing.

Each of the first receptacle and the second receptacle may comprise a main portion defined at least in-part by a curved surface disposed generally a radial distance about the hinge axis, and when disposed in the first state, the first cylindrical member is disposed in the main portion of the first receptacle and the second cylindrical member is disposed in the main portion of the second receptacle.

Each of the first receptacle and the second receptacle may further include an opening which extends outward from the main portion and is positioned generally about a central reference line oriented at an angle about the hinge axis to a reference plane disposed parallel to the a front face of the housing and in which the hinge axis lies.

The opening of each of the first receptacle and the second receptacle may include a first portion defined by generally parallel surfaces which extend outward from the main portion and define a minimum opening width of each of the first receptacle and the second receptacle, and when moving from the first state to the second state at least one of the first cylindrical member passes through the first portion of the first receptacle or the second cylindrical member passes through the first portion of the second receptacle.

The opening of each of the first receptacle and the second receptacle may further include a flared portion extending outward from the first portion in which the opening widens from the minimum opening width.

Each of the first cylindrical member and the second cylindrical member may be defined by an outer diameter which is greater than the minimum width and less than twice the radial distance.

Such needs are also met by embodiments of the disclosed concept which are directed to a circuit breaker. The circuit breaker comprises a housing and a trip unit selectively coupled to the housing. The housing includes a front cover selectively coupled to the housing, the front cover including an opening defined therethrough. The trip unit comprises a trip unit housing including a first receptacle and a second receptacle formed thereon or therein and a front face accessible via the opening of the front cover when the front cover is coupled to the housing. The front face includes a number of adjustment mechanisms for adjusting one or more characteristics of the trip unit. The trip unit further comprises an access door having a first cylindrical member extending along a hinge axis in a first direction, a second cylindrical member extending along the hinge axis in a second direction opposite the first direction, and a thickened portion having a contoured outer surface disposed adjacent the first cylindrical member and the second cylindrical member. When the front cover is uncoupled from the housing, the access door is moveable from: (i) a first state wherein the first cylindrical member is disposed in the first receptacle and the second cylindrical member is disposed in the second receptacle such that the access door is coupled to the housing and generally free to rotate about the hinge axis through at least a first predetermined degree range, and (ii) a second state in which the access door is decoupled from the housing responsive to the access door being rotated beyond the first predetermined degree range and the contoured outer surface interacting with a portion of the housing. When the access door is disposed in the first state and the front cover is coupled to the housing, the front cover restricts rotation of the access door about the hinge axis to a second predetermined degree range less than the first predetermined degree range.

Each of the first receptacle and the second receptacle may comprise a main portion defined at least in-part by a curved surface disposed generally a radial distance about the hinge axis, and when disposed in the first state, the first cylindrical member is disposed in the main portion of the first receptacle and the second cylindrical member is disposed in the main portion of the second receptacle.

Each of the first receptacle and the second receptacle may further include an opening which extends outward from the main portion and is positioned generally about a central reference line oriented at an angle about the hinge axis to a reference plane disposed parallel to the a front face of the housing and in which the hinge axis lies.

The opening of each of the first receptacle and the second receptacle may include a first portion defined by generally parallel surfaces which extend outward from the main portion and define a minimum opening width of each of the first receptacle and the second receptacle, and when moving from the first state to the second state at least one of the first cylindrical member passes through the first portion of the first receptacle or the second cylindrical member passes through the first portion of the second receptacle.

The opening of each of the first receptacle and the second receptacle may further include a flared portion extending outward from the first portion in which the opening widens from the minimum opening width.

Each of the first cylindrical member and the second cylindrical member may be defined by an outer diameter which is greater than the minimum width and less than twice the radial distance.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
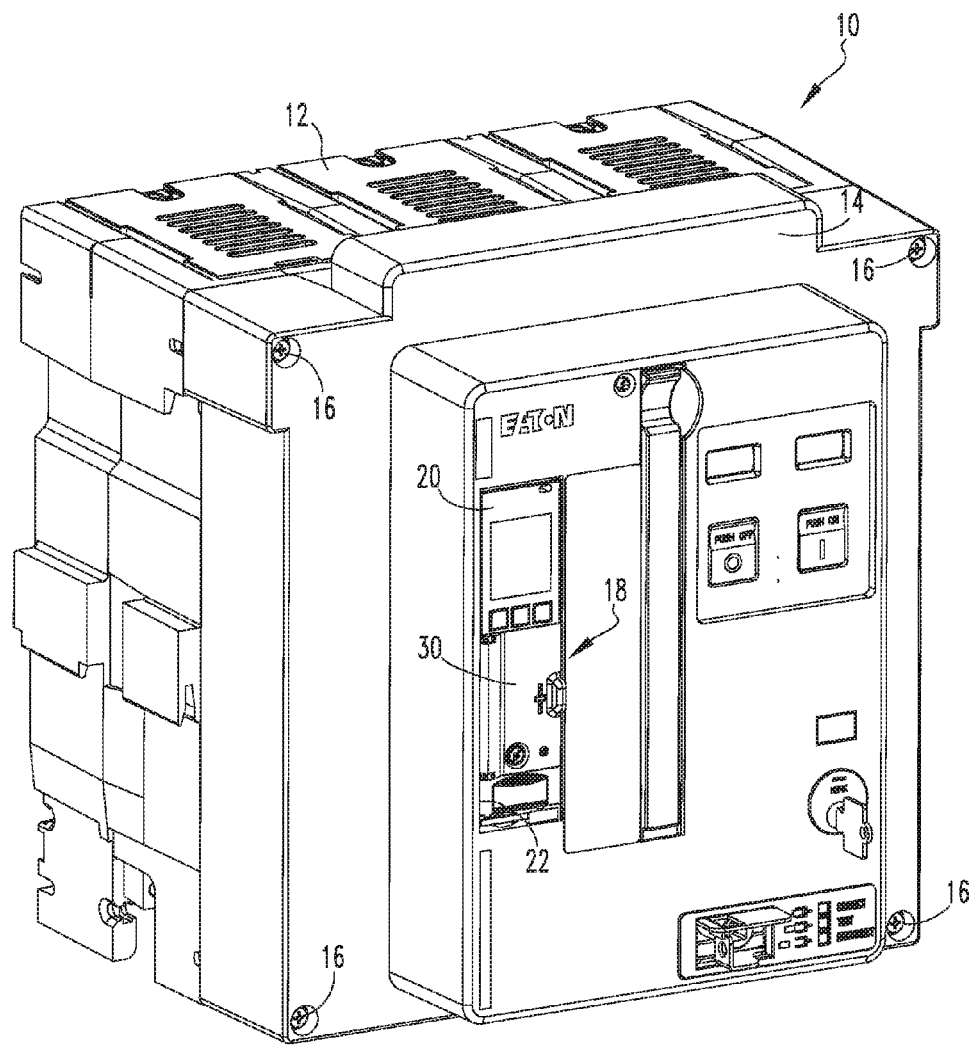
FIG. 1 is an isometric view of a circuit breaker including a trip unit having an access door in accordance with an example embodiment of the disclosed concept shown in a closed position.

Directional phrases used herein, such as, for example, left, right, front, back, top, bottom and derivatives thereof, relate to the orientation of the elements shown in the drawings and are not limiting upon the claims unless expressly recited therein.

As employed herein, the word "number" shall mean a quantity of one, or any integer greater than one (i.e., a plurality).

As employed herein, the statement that two or more parts are "coupled" together shall mean that the parts are joined together either directly or joined through one or more intermediate parts.

As employed herein, the statement that two or more parts are "selectively coupled" shall mean that the parts are secured together either directly or through one or more intermediate parts in a manner which may be readily undone.

Figure 2:
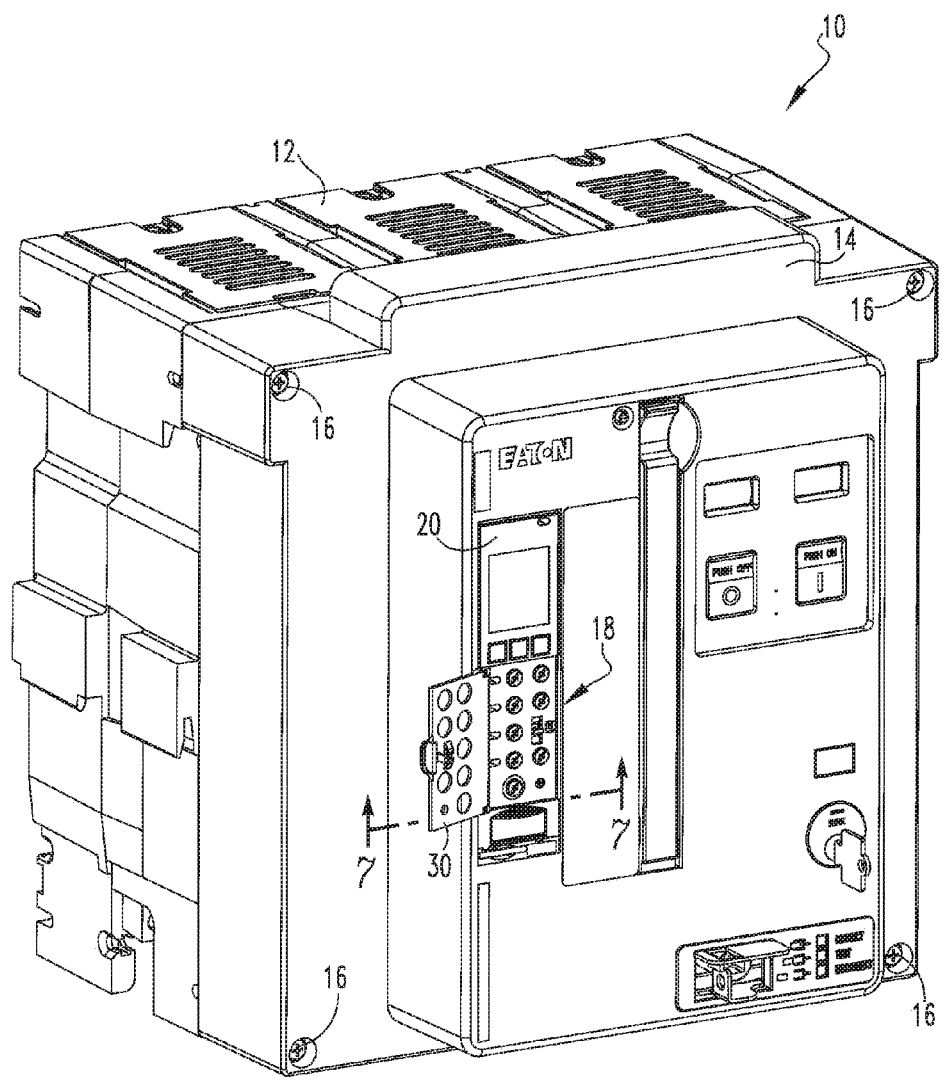
FIG. 2 is an isometric view of the circuit breaker of FIG. 1 showing the access door disposed in an open position.

A circuit breaker 10 in accordance with an example embodiment of the disclosed concept is shown in FIGS. 1 and 2. The circuit breaker 10 includes a molded housing 12 having a front cover 14 selectively coupled thereto via a number of suitable fasteners 16 (e.g., without limitation, screws). In an example embodiment in accordance with the disclosed concept, housing 12 was formed from Rosite 6060D Pantone 432 and front cover 14 was formed from Valox 3706 ANSI 61. It is to be appreciated, however, that other suitable materials may be employed without varying from the scope of the disclosed concept. Circuit breaker 10 includes a removable trip unit 18 (shown in greater detail in FIGS. 3 and 4) coupled to the housing 12 having a front face 20 accessible via an opening 22 defined in front cover 14.

Figure 3:
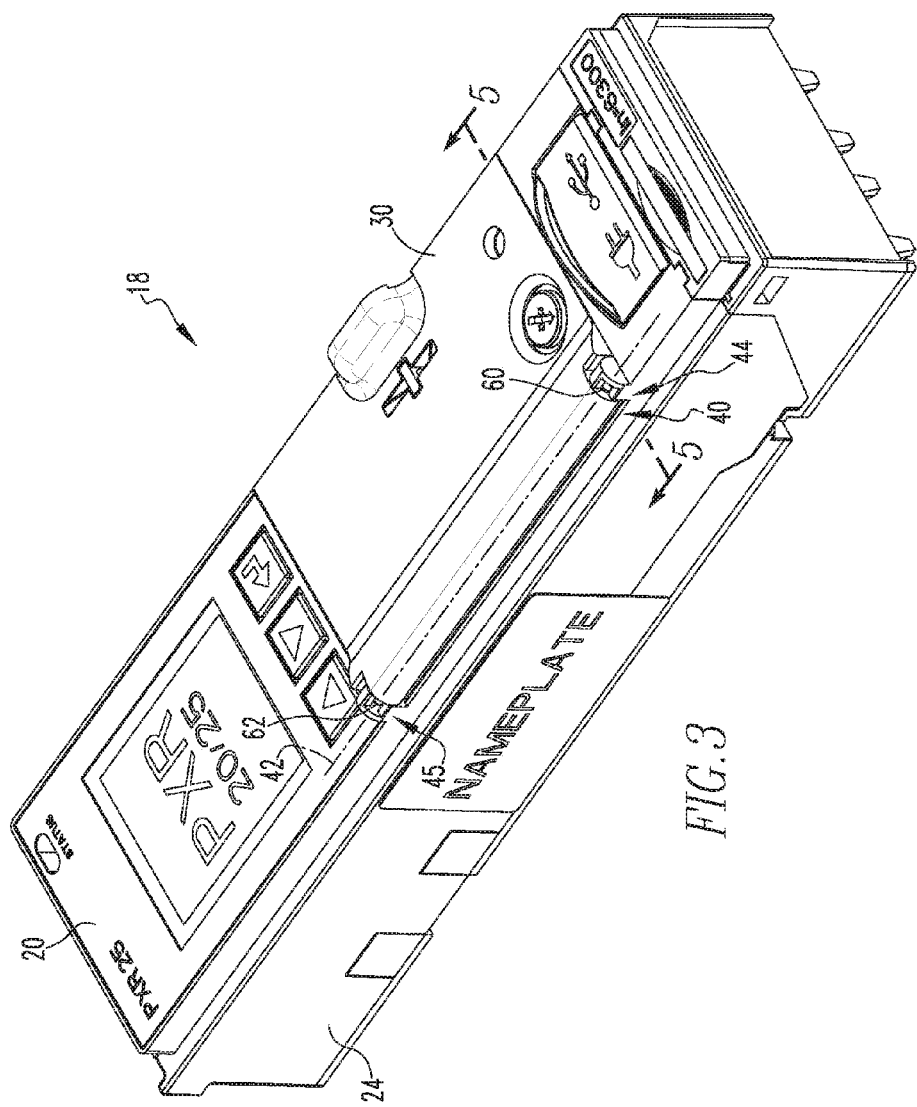
FIG. 3 is an isometric view of the trip unit of the circuit breaker of FIG. 1 shown with the access door disposed in a closed position.
Figure 4:
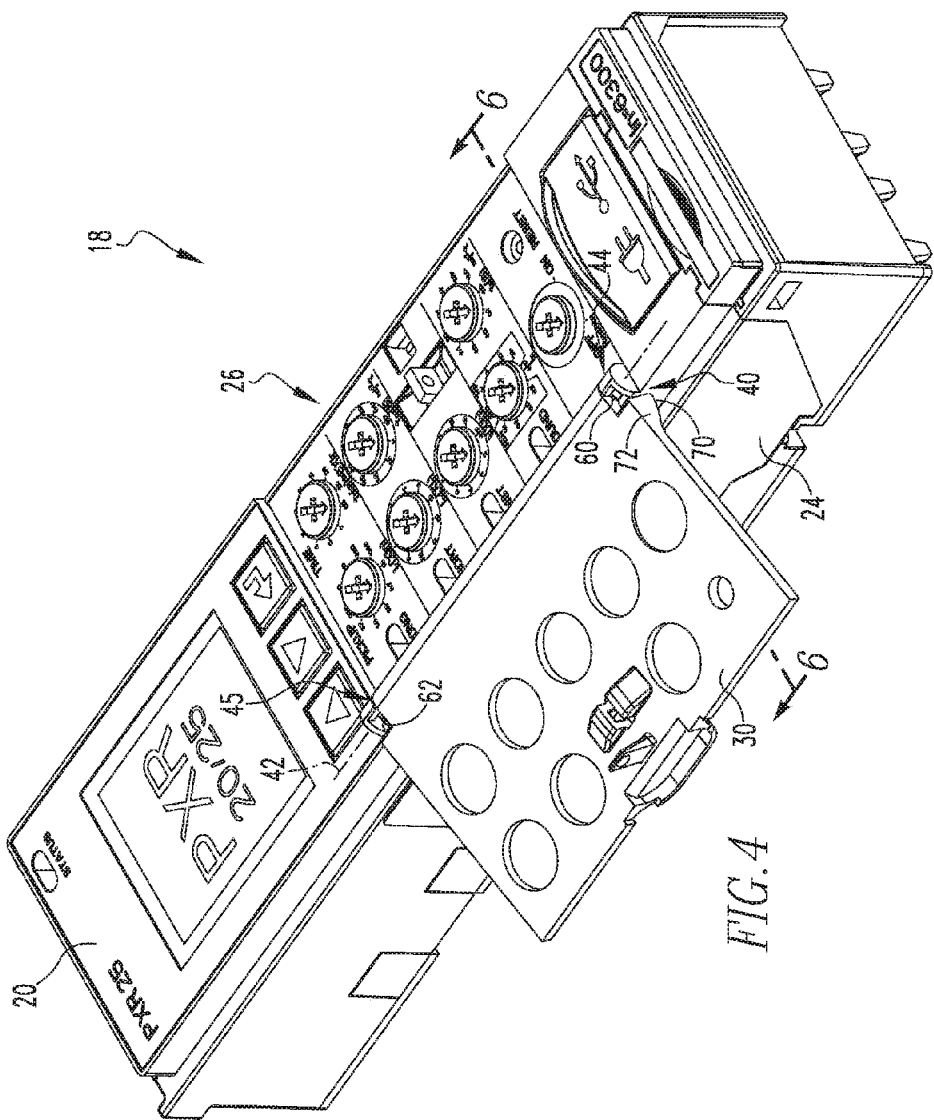
FIG. 4 is an isometric view of the trip unit of the circuit breaker of FIG. 1 shown with the access door disposed in an open position.

Referring to FIGS. 3 and 4, the front face 20 of the trip unit 18 forms part of a trip unit housing 24, which houses circuitry and related elements (not shown) disposed therein for controlling operation of the circuit breaker 10. In an example embodiment in accordance with the disclosed concept, the trip unit housing 24 was formed from Sabic Valox 732E with the front face 20 having an adhesive overlay placed on the housing 24. It is to be appreciated, however, that other suitable materials may be employed without varying from the scope of the disclosed concept. Front face 20 includes a number of adjustment mechanisms 26 (FIG. 4) for adjusting one or more characteristics of the trip unit 18. In order to allow for selective access to the adjustment mechanisms 26, the trip unit 18 further includes an access door 30 which is rotatably coupled to the trip unit housing 24 via a hinge assembly 40 such that the access door 30 is rotatable about a hinge axis 42 from among a closed position (such as shown in FIGS. 1 and 3) in which the access door 30 restricts access to the adjustment mechanisms 26, and an open position (such as shown in FIGS. 2 and 4) in which the access door does not restrict access to the adjustment mechanisms 26. In an example embodiment in accordance with the disclosed concept, the access door 30 was formed from Sabic LEXAN 141R clear. It is to be appreciated, however, that other suitable materials may be employed without varying from the scope of the disclosed concept.

Continuing to refer to FIGS. 3 and 4 as well as to the additional views of FIGS. 5-9, hinge assembly 40 is formed in-part by portions of the access door 30 and in-part by portions of the trip unit housing 24. More particularly, hinge assembly 40 includes a first receptacle 44 and a second receptacle 45 formed in or on the trip unit housing 24. Referring to the detail view of FIG. 9, the first receptacle 44 includes a main portion 46 defined at least in-part by a curved surface 47 disposed generally a radial distance r about the hinge axis 42. First receptacle 44 further includes an opening 48 which extends outward from the main portion 46 and is positioned generally about a central reference line C extending from the hinge axis 42 and oriented at an angle θ (FIG. 5) about the hinge axis 42 to a reference plane P disposed parallel to the front face 20 of the trip unit 18 and in which the hinge axis 42 lies. In examples of the disclosed concept, angles θ less than 90° were found to be unsuitable. Opening 48 includes a first portion 50 defined by generally parallel surfaces which extend outward from the main portion 46 and define a minimum opening width w of the first receptacle 44. Extending outward from the first portion 50 is a flared portion 52 in which opening 48 widens from the minimum opening width w. Second receptacle 45 is of generally similar shape and form as the first receptacle 44 and thus is not further described herein. The general purpose of such arrangement of each of the first and second receptacles 44, 45 will be discussed in detail further below. In an example embodiment in accordance with the disclosed concept, each of the first receptacle 44 and the second receptacle 45 were formed with a minimum opening width w of 0.060 in, an curved surface disposed a radial distance r of 0.047 in from the hinge axis 42, and a main portion disposed about a central reference line C disposed at 135° with respect to the reference plane P. It is to be appreciated, however, that other suitable values for such dimensions may be employed without varying from the scope of the disclosed concept.

Figure 5:
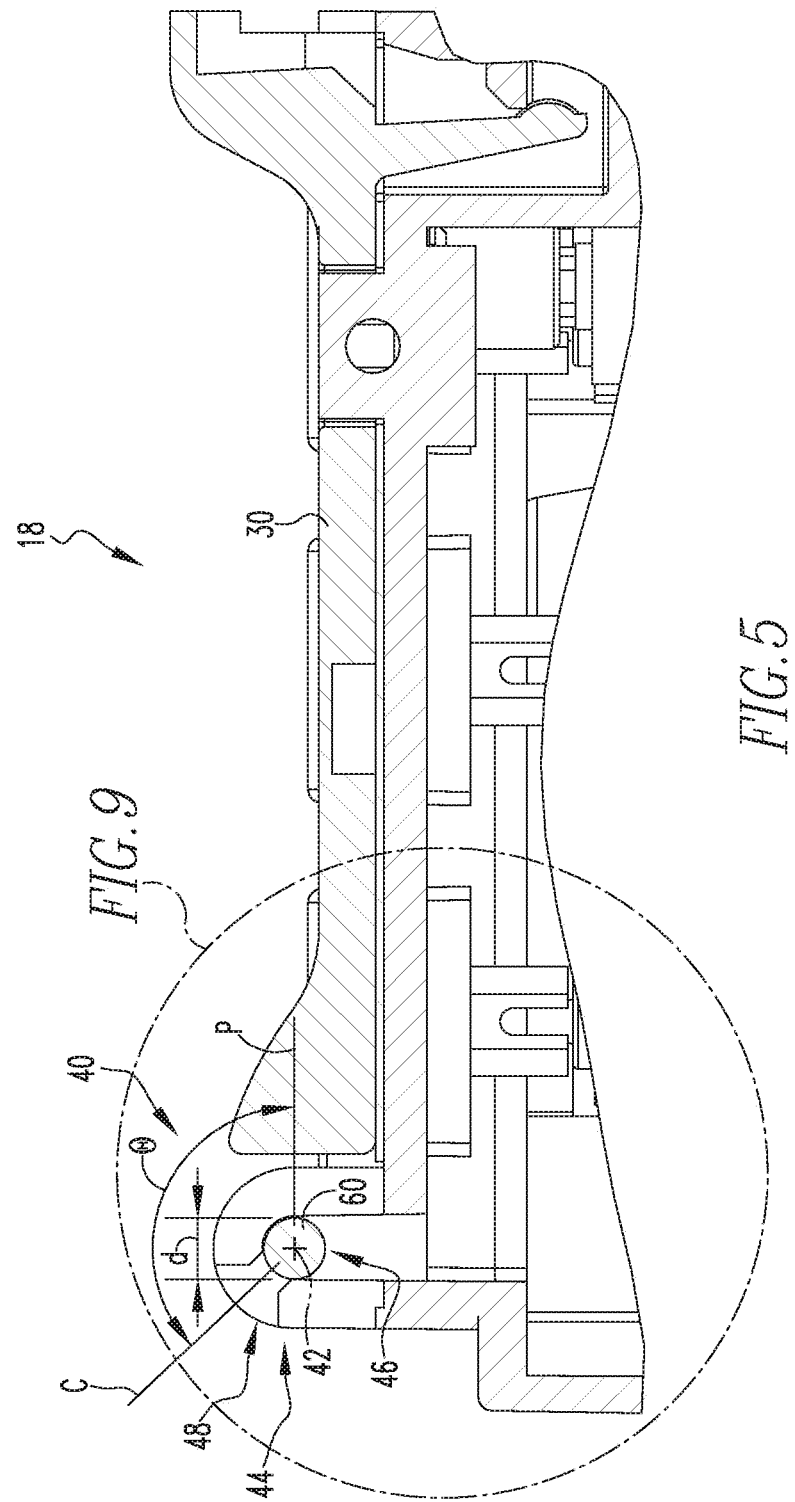
FIG. 5 is a sectional view of a portion of the trip unit and access door of FIG. 3 taken along line 5-5 thereof.

In addition to the first and second receptacle portions 44, 45, the hinge assembly 40 further includes corresponding portions of the access door 30 which interact with the portions of the trip unit housing 24. More particularly, referring to FIGS. 3 and 8, hinge assembly 40 includes a first cylindrical member 60 extending from the access door 30 along the hinge axis 42 in a first direction and a second cylindrical member 62 extending from the access door 30 along the hinge axis 42 in a second direction opposite the first direction. Each of the first and second cylindrical members 60 and 62 are of generally similar shape and construction and as shown in the sectional view of FIG. 5 are generally defined by an outer diameter d. As shown in the sectional views of FIGS. 5-7 and 9, the first cylindrical member 60 is sized to be disposed in the main portion 46 of first receptacle 44 (and similarly the second cylindrical member 62 in the corresponding portion of the second receptacle 45) such that the door 30 is coupled to, and generally free to rotate about hinge axis 42 from among a closed position (such as shown in FIGS. 1 and 3) and an open position (such as shown in FIGS. 2 and 4). Although not discussed in detail herein, it is to be appreciated that one or more suitable latching or locking mechanisms (not numbered) may be provided for securing the access door 30 in a closed position (such as shown in FIGS. 1 and 3) without varying from the scope of the disclosed concept.

In addition to the first and second cylindrical members 60 and 62, the access door 30 further includes a thickened portion 72 having a contoured outer surface 70 disposed adjacent the first and second cylindrical members 60 and 62 which are portions of the hinge assembly 40. The function of such features are discussed in detail below.

Having thus described the basic components and arrangement of the hinge assembly 40, benefits of such arrangement in regard to the assembly and potential disassembly thereof will now be discussed. In order to assemble the hinge assembly 40 (i.e., couple the access door 30 to the trip unit housing 24), each of the first and second cylindrical members 60 and 62 are first aligned with the corresponding openings (e.g., 48) of the first and second receptacles 44 and 45. The flared portion (e.g., 52) of each receptacle assists in centering the respective cylindrical member within the corresponding opening. Once both cylindrical members are centered in the openings of the respective receptacles, each of the cylindrical members are displaced through the first portion (e.g., of each opening via application of a suitable force applied to the access door 30 at or near each of the cylindrical members 60, 62 such that each of the cylindrical members "snaps" into the corresponding main portion (e.g., 46) of the respective receptacle. Accordingly, it is to be appreciated that access door 30 is generally "snap fit" to the trip unit housing 24.

Figure 6:
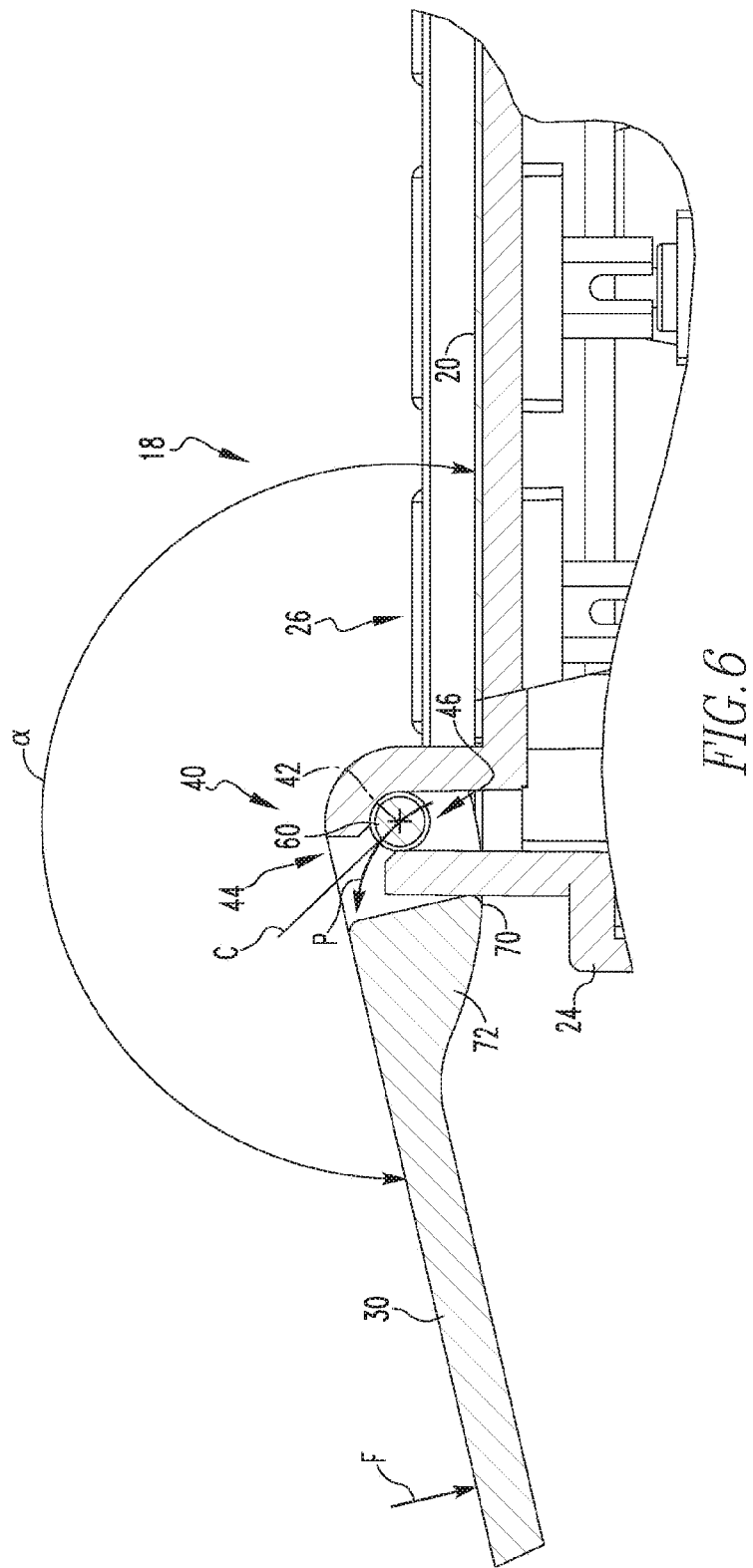
FIG. 6 is a sectional view of a portion of the trip unit and access door of FIG. 4 taken along line 6-6 thereof.

In addition to providing a ready snap fit assembly of the access door 30 to the trip unit housing 24, the hinge assembly 40 further allows for the access door 30 to readily detach from the trip unit housing 24 without damaging either the housing 24 or the door 30 in instances where known arrangements would typically break, and thus necessitate the need for replacement of one or both of the access door or the trip unit housing (which would necessitate replacement of the entire trip unit). As previously discussed, such an instance where failure commonly occurs is when the access door of a trip unit is opened beyond its intended range, such as readily occurs if the access door 30 is contacted while disposed in an open position such as by a technician moving in the vicinity of the access door or by attempting to install the front cover of a circuit breaker without having first closed the access door of the trip unit. FIGS. 4 and 6 show the trip unit 18, as previously described, with the access door 30 disposed in a fully open position. Such fully open position reached when the outer surface 70 of the thickened portion 72 of the access door 30 bears against a portion of the trip unit housing 24 and occurs when the access door 30 has been rotated through predetermined degree range a (FIG. 6) from the closed position (FIG. 5) about the hinge axis 30.

Referring to the sectional view of FIG. 6, if a force (shown generally by the arrow F) is applied to the access door 30 when the access door 30 is disposed in such full open position, the point of interaction (not numbered) between the outer surface 70 of the thickened portion 72 with the trip unit housing 24 relative to the location of the first cylindrical member 60 positioned within the main portion 46 of the first receptacle 44 results in the first cylindrical member 60 being forced generally along a path such as shown by the arrow P. As the path P passes generally along the central reference line C of the opening 48, the first cylindrical member 60 is thus forced from the first receptacle 44 (and similarly the second cylindrical member 62 is forced from the second receptacle 45) in a manner generally reverse to the snap fit assembly process previously described (i.e., one or both of the cylindrical members 60 and 62 are displaced outward through the first opening of the corresponding receptacle 44, 45). Through such movement, the access door 30 is readily un-snap fitted from the trip unit housing 24 in a manner that results in the access door 30 being uncoupled from the trip unit housing 24 without causing damage to any portion of the hinge assembly 40. In the example illustrated arrangement, such snap uncoupling begins to occur when the access door 30 is opened beyond a predetermined degree range a of approximately 190° and completely uncouples at about 195°. It is to be appreciated, however, that the point of such snap uncoupling may be adjusted to fit a particular application by varying the angular placement of the centerline C on which the opening of the receptacles are centered along with varying the profile of the outer surface 70 of the thickened portion 72 of the access door 30.

Figure 7:
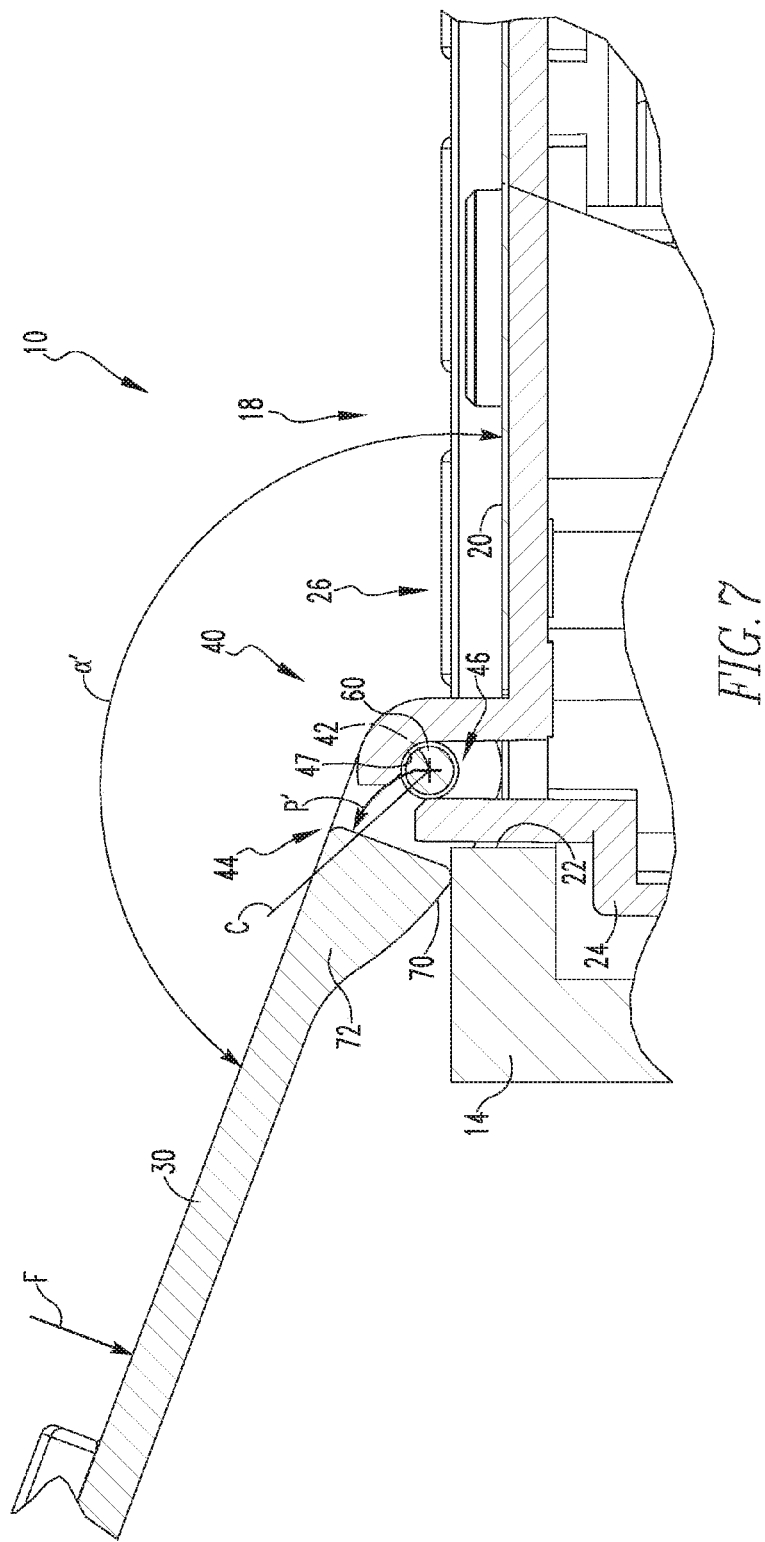
FIG. 7 is a sectional view of a portion of the trip unit and access door of FIG. 1 taken along line 7-7 thereof.
Figure 8:
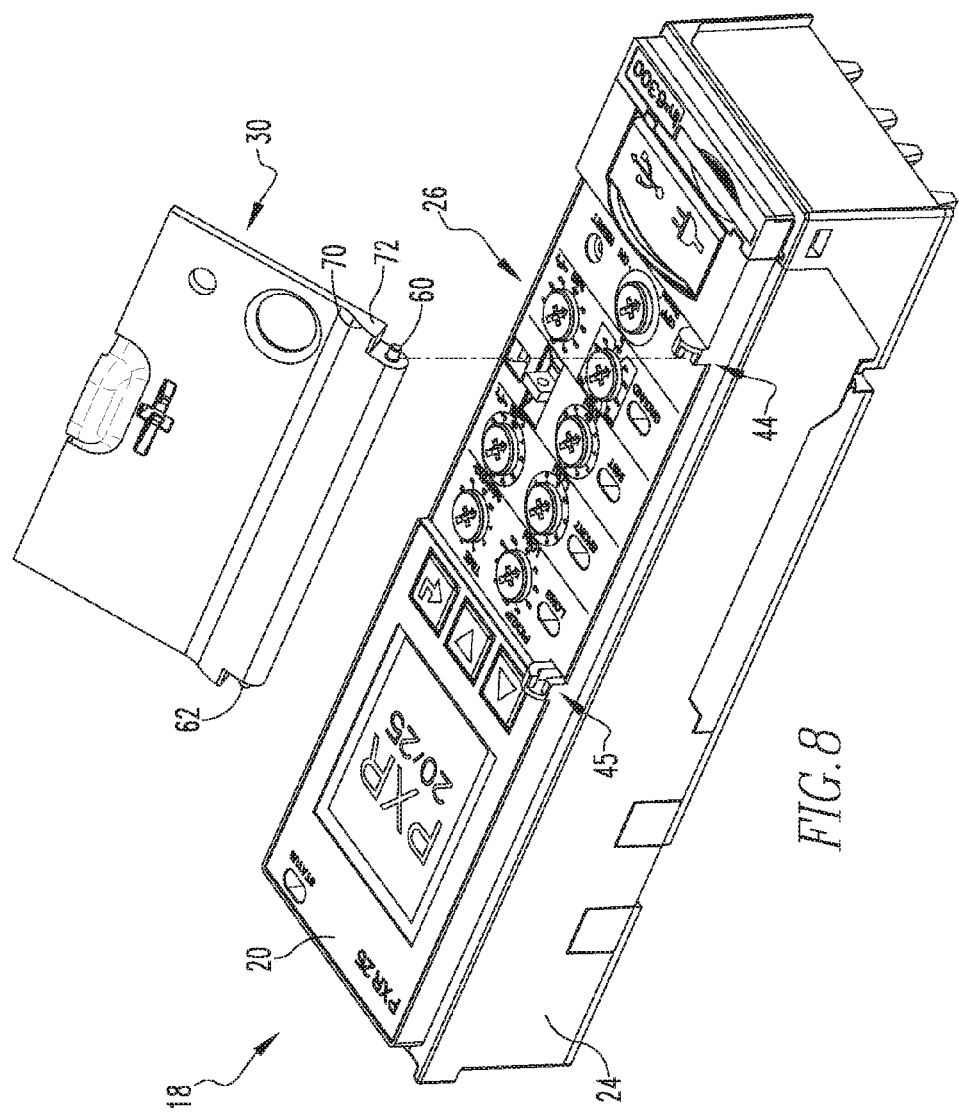
FIG. 8 is an exploded isometric view of the trip unit of FIG. 3 shown with an access door thereof uncoupled from the housing of the trip unit.
Figure 9:
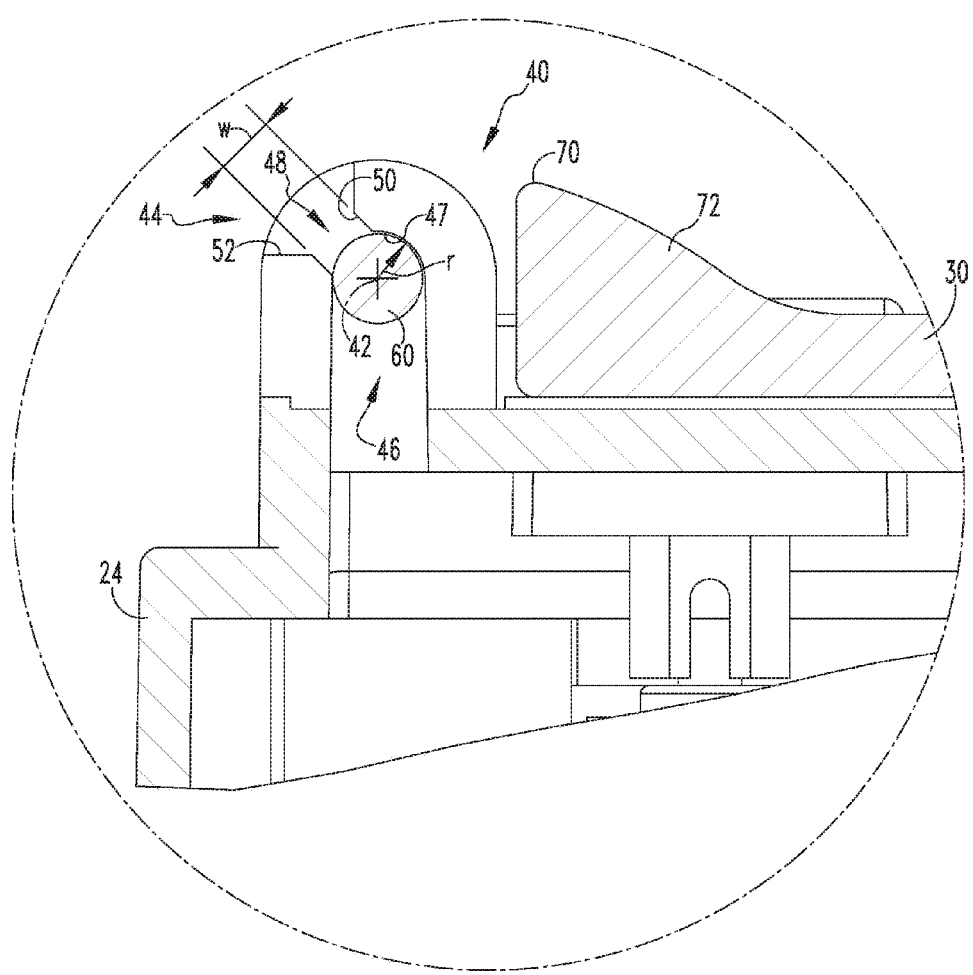
FIG. 9 is a detail view of a portion of the sectional view of FIG. 5.

In contrast to the functioning described in conjunction with FIGS. 4 and 6, FIG. 7 shows an example of the illustrated embodiment in operation when the front cover 14 is secured to the housing 12 of the circuit breaker 10 such that the front face 20 of the trip unit 18 is disposed in opening 22 of the front cover. If a force (shown generally once again by the arrow F) is applied to the access door 30 when the access door 30 is disposed in a full open position, which is restricted to a lesser opening predetermined degree range α' (as compared to the angle α, FIG. 6) due to the presence of the front cover 14 adjacent the trip unit housing 24, the interaction of the outer surface 70 of the thickened portion 72 with the front cover 14 of the circuit breaker 10 (in contrast to the interaction with the trip unit housing 24) results in the first cylindrical member 60 being forced generally along a path shown by the arrow P'. As the path P' does not pass along the central reference line C of the opening 48, but instead tends to be directed toward the curved surface 47 of the main portion 46 of the first receptacle 44, the first cylindrical member 60 is retained in the first receptacle 44 (and similarly the second cylindrical member 62 is retained in the second receptacle 45) and thus the access door 30 does not undesirably unsnap from the trip unit housing 24.

From the foregoing description, it is to be appreciated that the disclosed concept provides for an access door that is less likely to be damaged by a technician than existing arrangements. Further, the concept provides for an access door that will not be undesirably detached by a user of the circuit breaker who is merely accessing the adjustment mechanisms of the trip unit.

While example embodiments of the disclosed concept have been shown with respect to an access door of a trip unit, it is also contemplated that the disclosed concept may be employed in other applications where selective uncoupling of an access door or similar structure would be desirable.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A hinge assembly comprising:
   a first portion; and
   a second portion,
   wherein one of the first portion or the second portion includes a first receptacle and a second receptacle,
   wherein the other one of the first portion or the second portion includes a first cylindrical member extending along a hinge axis in a first direction, a second cylindrical member extending along the hinge axis in a second direction opposite the first direction, and a thickened portion having a contoured outer surface disposed adjacent the first cylindrical member and the second cylindrical member,
   wherein the second portion is moveable from:
   (i) a first state wherein the first cylindrical member is disposed in the first receptacle and the second cylindrical member is disposed in the second receptacle such that the second portion is coupled to the first portion and generally free to rotate about the hinge axis through at least a predetermined degree range, and
(ii) a second state in which the second portion is decoupled from the first portion responsive to the second portion being rotated beyond the predetermined degree range and the contoured outer surface interacting with a portion of the first portion, wherein each of the first receptacle and the second receptacle comprises a main portion defined at least in-part by a curved surface disposed generally a radial distance about the hinge axis, and wherein when disposed in the first state, the first cylindrical member is disposed in the main portion of the first receptacle and the second cylindrical member is disposed in the main portion of the second receptacle, wherein each of the first receptacle and the second receptacle further includes an opening which extends outward from the main portion and is positioned generally about a central reference line, wherein the opening of each of the first receptacle and the second receptacle has a minimum opening width, wherein when moving from the first state to the second state at least one of the first cylindrical member passes through the first portion of the first receptacle or the second cylindrical member passes through the first portion of the second receptacle, and wherein each of the first cylindrical member and the second cylindrical member are defined by an outer diameter which is greater than the minimum width.

2. The hinge assembly of claim 1, wherein the opening of each of the first receptacle and the second receptacle is defined by generally parallel surfaces which extend outward from the main portion and define the minimum opening width.

3. The hinge assembly of claim 2, wherein the opening of each of the first receptacle and the second receptacle includes a flared portion disposed adjacent the parallel surfaces opposite the main portion in which the opening widens from the minimum opening width.

4. The hinge assembly of claim 1, wherein the outer diameter of each of the first cylindrical member and the second cylindrical member is less than twice the radial distance.

5. A trip unit comprising:
a housing; and
an access door,
wherein one of the housing or the access door includes a first receptacle and a second receptacle,
wherein the other one of the housing or the access door includes a first cylindrical member extending along a hinge axis in a first direction, a second cylindrical member extending along the hinge axis in a second direction opposite the first direction, and a thickened portion having a contoured outer surface disposed adjacent the first cylindrical member and the second cylindrical member,
wherein the access door is moveable from:
(i) a first state wherein the first cylindrical member is disposed in the first receptacle and the second cylindrical member is disposed in the second receptacle such that the access door is coupled to the housing and generally free to rotate about the hinge axis through at least a predetermined degree range, and
(ii) a second state in which the access door is decoupled from the housing responsive to the access door being rotated beyond the predetermined degree range and the contoured outer surface interacting with a portion of the first portion, wherein each of the first receptacle and the second receptacle comprises a main portion defined at least in-part by a curved surface disposed generally a radial distance about the hinge axis, and wherein when disposed in the first state, the first cylindrical member is disposed in the main portion of the first receptacle and the second cylindrical member is disposed in the main portion of the second receptacle, wherein each of the first receptacle and the second receptacle further includes an opening which extends outward from the main portion and is positioned generally about a central reference line, wherein the opening of each of the first receptacle and the second receptacle has a minimum opening width, wherein when moving from the first state to the second state at least one of the first cylindrical member passes through the first portion of the first receptacle or the second cylindrical member passes through the first portion of the second receptacle, and wherein each of the first cylindrical member and the second cylindrical member are defined by an outer diameter which is greater than the minimum width.

6. The trip unit of claim 5, wherein the opening of each of the first receptacle and the second receptacle is defined by generally parallel surfaces which extend outward from the main portion and define the minimum opening width.

7. The trip unit of claim 6, wherein the opening of each of the first receptacle and the second receptacle includes a flared portion disposed adjacent the parallel surfaces opposite the main portion in which the opening widens from the minimum opening width.

8. The trip unit of claim 5, wherein the outer diameter of each of the first cylindrical member and the second cylindrical member is less than twice the radial distance.

9. A circuit breaker comprising:
a housing including a front cover selectively coupled to the housing, the front cover including an opening defined therethrough; and
a trip unit selectively coupled to the housing, the trip unit comprising:
a trip unit housing including a front face accessible via the opening of the front cover when the front cover is coupled to the housing, the front face having a number of adjustment mechanisms for adjusting one or more characteristics of the trip unit; and
an access door,
wherein one of the trip unit housing or the access door includes a first receptacle and a second receptacle formed thereon or therein,
wherein the other one of the trip unit housing or the access door includes a first cylindrical member extending along a hinge axis in a first direction, a second cylindrical member extending along the hinge axis in a second direction opposite the first direction, and a thickened portion having a contoured outer surface disposed adjacent the first cylindrical member and the second cylindrical member,
wherein, when the front cover is uncoupled from the housing, the access door is moveable from:
(i) a first state wherein the first cylindrical member is disposed in the first receptacle and the second cylindrical member is disposed in the second receptacle such that the access door is coupled to the housing and generally free to rotate about the hinge axis through at least a first predetermined degree range, and (ii) a second state in which the access door is decoupled from the housing responsive to the access door being rotated beyond the first predetermined degree range and the contoured outer surface interacting with a portion of the housing, and wherein, when the access door is disposed in the first state and the front cover is coupled to the housing, the front cover restricts rotation of the access door about the hinge axis to a second predetermined degree range less than the first predetermined degree range.

10. The circuit breaker of claim 9, wherein each of the first receptacle and the second receptacle comprises a main portion defined at least in-part by a curved surface disposed generally a radial distance about the hinge axis, and wherein when disposed in the first state, the first cylindrical member is disposed in the main portion of the first receptacle and the second cylindrical member is disposed in the main portion of the second receptacle.

11. The circuit breaker of claim 10, wherein each of the first receptacle and the second receptacle further includes an opening which extends outward from the main portion and is positioned generally about a central reference line oriented at an angle about the hinge axis to a reference plane disposed parallel to the a front face of the housing and in which the hinge axis lies.

12. The circuit breaker of claim 11, wherein the opening of each of the first receptacle and the second receptacle is defined by generally parallel surfaces which extend outward from the main portion and define a minimum opening width of each of the first receptacle and the second receptacle, and wherein when moving from the first state to the second state at least one of the first cylindrical member passes through the first portion of the first receptacle or the second cylindrical member passes through the first portion of the second receptacle.

13. The circuit breaker of claim 12, wherein the opening of each of the first receptacle and the second receptacle further includes a flared portion extending from the generally parallel surfaces in which the opening widens from the minimum opening width.

14. The circuit breaker of claim 12, wherein each of the first cylindrical member and the second cylindrical member are defined by an outer diameter which is greater than the minimum width.

15. The circuit breaker of claim 12, wherein the outer diameter of each of the first cylindrical member and the second cylindrical member is less than twice the radial distance.

* * * * *